(12) United States Patent
Buttard (10) Patent No.: US 8,329,017 B2
(45) Date of Patent: Dec. 11, 2012

(54) METHOD FOR ELECTROCHEMICALLY STRUCTURING A CONDUCTIVE OR SEMICONDUCTOR MATERIAL, AND DEVICE FOR IMPLEMENTING IT

(75) Inventor: Denis Buttard, Claix (FR)

(73) Assignee: Commissariat a l'Energie Atomique, Paris (FR)

( * ) Notice: Subject to any disclaimer, the term of this patent is extended or adjusted under 35 U.S.C. 154(b) by 694 days.

(21) Appl. No.: 12/281,595

(22) PCT Filed: Feb. 6, 2007

(86) PCT No.: PCT/FR2007/000211
§ 371 (c)(1),
(2), (4) Date: Nov. 25, 2008

(87) PCT Pub. No.: WO2007/009210
PCT Pub. Date: Sep. 7, 2007

(65) Prior Publication Data
US 2009/0255820 A1 Oct. 15, 2009

(30) Foreign Application Priority Data
Mar. 3, 2006 (FR) ...................... 06 01924

(51) Int. Cl.
C25D 5/02 (2006.01)
C25D 17/00 (2006.01)
(52) U.S. Cl. ............... 205/136; 204/224 R; 204/224 M
(58) Field of Classification Search .................. 205/96, 205/136; 204/224 R, 224 M
See application file for complete search history.

(56) References Cited

U.S. PATENT DOCUMENTS 5,976,331 A * 11/1999 Chang et al. ............ 204/224 R
6,077,412 A * 6/2000 Ting et al. .................... 205/143
2002/0086551 A1 * 7/2002 Beetz et al. ................... 438/745
2003/0019756 A1 * 1/2003 Yoshida et al. ................. 205/88
2003/0111346 A1 6/2003 Zdunek
2007/0089993 A1 * 4/2007 Schwartz et al. ............. 205/133

FOREIGN PATENT DOCUMENTS

| WO | WO 99/45179 | 9/1999 |
| WO | WO 02/103085 | 12/2002 |
| WO | WO 2004/099469 | 11/2004 |
| WO | WO 2005/033798 | 4/2005 |
| WO | WO 2006/010888 | 2/2006 |

* cited by examiner

*Primary Examiner* — Luan Van
(74) *Attorney, Agent, or Firm* — Morgan, Lewis & Bockius LLP (57) ABSTRACT

The invention relates to a method and to a device for electrochemical micro- and/or nano-structuring, which are reliable, fast, simple, easy to implement, and reproducible. For this purpose, the invention provides a method of electrochemically structuring a sample (12) of conductive or semiconductor material that has opposite front and rear faces (11 and 13). The method comprises the steps consisting: in putting at least the front face (11) of the sample (12) into contact with at least one electrolytic solution (4) stored in at least one tank (3); in placing at least one counter-electrode (6) in an electrolyte (4) in register with the front face (11) of the sample (12), said front face (11) being for structuring; in placing at least one working electrode (7) presenting structuring patterns (14) into dry ohmic contact with the rear face (13) of the sample (12); and in applying an electric current between at least one counter-electrode (6) and at one least working electrode (7) that are substantially in register with each other in order to obtain an electrochemical reaction at the interface between the front face (11) of the sample (12) and the electrolyte (4) with current density that is modulated by the structuring patterns (14) of the working electrode (7) in order to perform etching and/or deposition on the front face (11) of the sample (12).

20 Claims, 3 Drawing Sheets

METHOD FOR ELECTROCHEMICALLY STRUCTURING A CONDUCTIVE OR SEMICONDUCTOR MATERIAL, AND DEVICE FOR IMPLEMENTING IT

RELATED APPLICATIONS

The present application is a U.S. National Phase Application of International Application PCT/FR2007/000211, filed Feb. 6, 2007, which claims the benefit of France Application No. 06/01924, filed Mar. 3, 2006, all of which are herein incorporated by reference in their entirety.

The invention relates to an electrochemical method of micro- and/or nano-structuring a conductive or semiconductor material, in particular for fabricating individual microelectronic components, and it also relates to a device for implementing the method.

In general, the fast and regular decrease in the size of individual components in microelectronics has led to novel materials being fabricated and studied at micrometer and nanometer dimensions. These materials need subsequently to be integrated in components, thus leading to the provision of devices having dimensions that are very small, and that need to satisfy fabrication criteria such as simplicity, speed, power, and low fabrication cost.

In order to obtain these individual components, the materials used need to be subjected to various elaborate technological steps such as structuring (etching and/or deposition) that can be thought of under two headings: dry structuring; and structuring in a liquid medium.

By way of example, dry structuring makes it possible to make structures that are anisotropic, regardless of whether the material is crystalline or amorphous, however it requires equipment that is expensive and involves high technology, giving rise amongst other things to defects in the surface state of samples.

In contrast, structuring in a liquid medium is simple to implement and thus represents a fabrication cost that is low. It comprises two subcategories: chemical structuring; and electrochemical structuring.

Chemical structuring is the simplest technique, it consists in fitting the sample with a mask, and dipping it in various baths in order to obtain the desired structure—however the technique can be sensitive to the crystalline nature of the material, such that reactions need not be identical, depending on whether the material is amorphous or crystalline. When crystalline, reactions can occur in privileged manner in crystallographic directions. Furthermore, chemical structuring is uniform, such that no structuring can be obtained in the absence of a mask on each sample that is to be structured.

Structuring by the electrochemical technique offers the advantage of being inexpensive and requiring few technological steps, and of implementing reactions that are anisotropic and relatively independent of the crystalline nature of the material. The main limitation on electrochemical reactions is making electrical contact with the sample through which an electric current needs to be passed. In addition, the sample must necessarily be made of a material that is a conductor or a semiconductor. There exist numerous examples of electrochemistry being used, both in the laboratory and in industry: cathodic reduction serves to deposit metals (Mg, Ni, Pd, Fe, Sn, etc.), and also to deposit alloys (Cu—Sn, Cu—Zn, Ni—Zn, etc.); anodic oxidation serves to perform electropolishing and etching, e.g. on aluminum where a layer of $Al_2O_3$ is formed that provides protection against corrosion and also provides electrical insulation. In the context of semiconductors, mention can be made of silicon electrochemistry that enables the material to be completely or partially electropolished (anodic oxidation) and also that enables various forms of electrodeposition to be performed (cathodic reduction).

There follow three concrete examples in concerning the realization of micro- and/or nano-structures.

The first example concerns realizing silicon samples that are twisted and bonded—a term that is explained below—followed by chemical etching. In this example, two monocrystalline silicon wafers are bonded together by molecular type bonding with an offset angle, as described by Wallis and D. I. Pomerantz, J. Appl. Phys. 40, 3946 (1969), [Wallis et al. 1969], by M. Schimbo, K. Furukawa, K. Fukuda, and K. Tanzawa, J. Appl. Phys. 60, 2987 (1986) [Schimbo et al. 1968], and by D. Buttard, J. Eymery, F. Fournel, P. Gentile, F. Leroy, N. Magnea, H. Moriceau, G. Renaud, F. Rieutord, K. Rousseau, J. L. Rouviere, IEEE, J. Quantum Electronics 38, 995-1005 (2002) [Buttard et al. 2002].

After annealing, this bonding (without adhesive) induces a lattice of dislocations that are accurately located in the interface plane of the bonding. This super-lattice induces a periodic field of lateral deformation. If the top layer is thin enough (e.g. 10 nanometers (nm) thick), this periodic field emerges at the surface. The distance between the dislocations (several nm to several 100 nm) is fully controlled by controlling the offset angle imparted between the two wafers prior to bonding, as demonstrated in particular by F. Fournel, H. Moriceau, B. Aspar, K. Rousseau, J. Eymery, J. L. Rouviere, N. Magnea, Appl. Apys. Lett. 80, 793 (2002) [F. Fournel et al., 2002]. Preferential chemical or electrochemical etching of these lines of dislocations then makes it possible to make self-organized nano-structures of silicon that present great perfection, as demonstrated in particular (using a chemical technique) by F. Leroy, J. Eymery, P. Gentile, F. Rournel, Surface Science 545, 211 (2003) [F. Leroy et al., 2003].

Nevertheless, chemically etching lines of dislocations reaches depths of only a few nm to a maximum of 10 nm. Beyond that, the surface is subjected to a leveling phenomenon. Furthermore, the method is complex since the technological steps to achieve molecular bonding are numerous and require the use of a white room. It is therefore very expensive and difficult to implement industrially.

A second example concerns making nano-wires that can be obtained by growth using a vapor-liquid-solid (VLS) method. Wagner and Ellis, Appl. Phys. Lett. 4 (5) Mar. 1, 1965 [Wagner and Ellis, 1964], and J. W. Dailey, J. Taraci, and T. Clement, J. Appl. Phys., 96 (12), Dec. 15, 2004 [J. W. Dailey et al. 2004] have shown that this growth technique makes it possible, when using a metallic catalyst, to make semiconductor wires with a diameter of less than 100 nm by performing two steps: firstly depositing and structuring a catalyst on a plane surface in the form of nano-drops; and subsequently controlled and localized growth of nano-wires under the catalyst. By way of example, when selecting gold as the catalyst and silicon as the base material, the VLS method consists in delivering matter in gaseous form, e.g. silane $SiH_4$ to the surface of the substrate (semiconductor, glass, etc. . . . ) onto which a metallic catalyst has previously been deposited. From a study of the binary phase diagram of the catalyst and silicon, it is possible to heat the sample to above the eutectic temperature of the mixture, thereby making it possible to obtain the catalyst in the form of liquid drops. This step is called de-wetting. The resulting mass then forms a liquid binary mixture with silicon. By continuously delivering gaseous silane, the binary silicon mixture is enriched up to saturation. The silicon then precipitates and forms the wire. The wire grows in crystalline manner so long as matter is being delivered and so long as the catalyst is in liquid form. Growth is complex and involves numerous parameters:

the annealing temperature is responsible for the de-wetting of the catalyst, this annealing also providing a surface that is clean by eliminating all dust and any other oxide layer that might have formed prior to growth;

the catalyst drop diameter defines the wire diameter;

the growth temperature (about the eutectic temperature) determines the shape and the quality of the wire;

the length of time that growth is performed determines the length of the nano-wires;

the flow of silane ($SiH_4$) mixed with gaseous hydrogen also determines the length of the wires; and since everything takes place in a white room, there are numerous technological problems, given that the catalyst most commonly used is gold, which is not compatible with microelectronics because of its diffusing properties.

That growth method requires a large installation that is complex and expensive to implement.

Another method of making nano-wires is nano-printing lithography, described by T. Martensson, P. Carlberg, M. Borgström, L. Montelius, W. Seifert, L. Samuelson, Nanoletters 4, 699 (2004) [T. Martensson et al., 2004]. Although less expensive than traditional lithography, that method continues to require numerous microelectronic means. Furthermore, the wires obtained cannot present a diameter of less than 300 nm.

Finally, the third example relates to making porous silicon by an electrochemical technique that is described in particular in the articles by A. Ulhir, Bell System Tech. J. 35 333 (1956) [A. Ulhir et al., 1956], by D. R. Turner, J. Electrochem. Soc. 105, 402 (1958) [D. R. Turner et al., 1958], and by G. Cullis, L. T. Canham, P. D. J. Calcott, J. Appl. Phys. 82, 909 (1997) [G. Cullis et al., 1997].

Under the particular conditions of the reactions (by adapting parameters such as current density, hydrofluoric acid concentration, or anodization time), the electropolishing of the silicon becomes partial, thus making it possible to obtain a crystalline nanometric porous structure. Depending on the nature and the doping level of the original substrate, various nano- and/or micro-porous structures are obtained. For example, the diameter of the pores and of the crystallines is of the order of 2 nm to 3 nm up to a few tens of nanometers for a p-doped substrate. Porous silicon has been widely studied over the last few years, in particular for its light-emitting properties and also for its highly porous and crystalline nature, where its porosity may be as great as 90%.

Parallel methods have also been used, such as, for example: those described by T. Nakagawa, H. Sugiyama, N. Koshida, Jpn J. Appl. Phys. 37, 7186 (1998) [T. Nakagawa et al., 1998] for realizing periodic structures by fabricating porous silicon under a magnetic field, or by G. Lerondel, R. Romestain, J. C. Vial, M. Thönnissen, Appl. Phys. Lett. 71, 196 (1997) [G. Lerondal et al. 1997], for realizing lateral super-lattices by lightwave interference.

Nevertheless, in all circumstances, the porous structure of the porous silicon is disordered and does not present any periodicity. In particular, the starting points of the etching occur at defects, and they are therefore not controlled in position. For devices based on porous silicon, the structures achieved are generally "quite coarse" (several micrometers ($\mu$m) for optical methods, and several hundreds of nm for other methods). In addition, those methods require a large number of technological steps.

Furthermore, patent document WO 99/45179 describes an electrochemical cell into which the material for etching is immersed while in direct electrical contact with the electric circuit. An electrode provided with a perforated etching mask is placed in the vicinity of the material, but not in contact therewith. The perforated mask used is insulating, i.e. the electrode portions that are covered by the mask do not deliver current, whereas the portions of the electrode that are not covered, i.e. portions that are situated in register with the holes in the mask do deliver current. Current transmission therefore takes place through the mask, and then through the electrolyte, so as to give rise to the desired electrochemical reaction on the remote surface of the material that is to be etched. The material is covered in a protective layer for preventing it from being attacked by the electrolyte. When current passes, the protective layer situated in register with the holes in the mask is dissolved, and the electrolyte leaks into the material. The drawback of that method lies in the sensitivity of the material to the electrolyte, which requires very great vigilance once the chemical reaction for dissolving the protective layer has begun in order to ensure firstly that etching is sufficient and secondly that is not too deep. Furthermore, since the reaction takes place remotely in the electrolyte, the chemical reaction can spread, to a small and random extent, onto the surface that is situated in register with the insulating mask, such that etching is neither accurate nor reproducible. Finally, deposition is not possible since the electrolyte can be used only for etching the material.

Patent document WO 02/103085 solves the above problem by proposing pressing the electrode provided with an insulating perforated mask against the surface of the material that is to be structured. Electrolyte is thus enclosed in the insulating portions in relief of the mask, the electrode, and the material for structuring. Depending on how the electrode and the material are connected, it is possible to perform deposition and/or etching. Once more, current passes through the mask and then through the electrode in order to give rise to the desired chemical reaction on the surface of the material to be structured. Nevertheless, during the chemical reaction, the electrolyte becomes depleted or enriched, such that it is necessary to provide an electrolyte drainage system in order to control the reaction. Such a system is expensive, difficult to implement, and sometimes impossible when certain patterns need to be made.

Finally, contrary to the preceding documents, patent document WO 2004/099469 proposes performing micro- or nano-structuring of a sample with the help of an electrode that is provided with a conductive etching mask. The electrode is constituted by a plate having nano-sized conductive portions in relief deposited thereon. The gaps situated between these nano-portions in relief do not convey current and can be filled with an insulating material. The electrode is placed close to, but not in contact with, the material for etching, which is itself electrically connected directly to the electric circuit. Current therefore passes via the mask and through the electrolyte so as to give rise to the desired chemical reaction on the surface of the material for structuring. The drawback of such a device lies in the need, on each occasion, to adapt the distance between the structured electrode and the material in order to enable growth to an appropriate height or etching to an appropriate depth to take place for the nano-structures on the surface of the material. This variation in distance can lead to a small lateral offset of the electrode and can cause the structuring to be inaccurate and slightly random.

On the basis of the above state of the art, the object of the present invention is thus to propose a novel method of electrochemical structuring that is reliable, fast, simple, easy to implement, and highly reproducible, being based on using an electrode that is electrically connected to a conductive etching mask that is pressed with dry ohmic contact against a rear face of a sample of conductive or semiconductor material, and placing the portion of this material that is for etching in an electrolyte in the vicinity of an electrode.

The invention thus provides a method of electrochemically micro- and/or nano-structuring a sample of a conductive or semiconductor material having two opposite faces, namely a front face and a rear face, the method being characterized in that it comprises the steps consisting in:

a) putting at least the front face of the sample into contact with at least one electrolytic solution stored in at least one tank;

b) placing at least one counter-electrode in an electrolyte in register with the front face of the sample, said front face being for structuring;

c) placing at least one working electrode presenting structuring patterns into dry ohmic contact with the rear face of the sample; and d) applying an electric current between at least one counter-electrode and at one least working electrode that are substantially in register with each other in order to obtain an electrochemical reaction at the interface between the front face of the sample and the electrolyte with current density that is modulated by the structuring patterns of the working electrode in order to perform etching and/or deposition on the front face of the sample.

In particular embodiments, depending on the flow direction of the current, the electrochemical reaction is either an oxidation reaction leading to etching of the front face of the sample, or a reduction reaction leading to deposition on the front face of the sample.

The oxidation reaction leading to etching is obtained by causing at least one counter-electrode to act as a cathode and the working electrode substantially in register therewith to act as an anode, and using an electrolytic solution that is preferably acidic, which acid may be hydrofluoric acid; hydrochloric acid; orthophosphoric acid; oxalic acid; sulfuric acid; or chromic acid; and at varying concentrations, depending on the acid used and in accordance with known practices of the person skilled in the art.

The reduction reaction leading to a deposit is obtained by causing at least one counter-electrode to act as an anode and causing the working electrode substantially in register therewith to act as a cathode, and with an electrolytic solution that is a function of the material that is to be deposited on the front face of the sample, such as, for example a solution of $CuSO_4$, $CoSO_4$, $FeSO_4$, $NiSO_4$, $SnSO_4$, $ZnSO_4$, etc.

The invention also provides a device for electrochemically structuring a sample of a conductive or semiconductor material that has two opposite faces, namely a front face and a rear face, the device serving to implement the above method, the device comprising an electrochemical cell provided with at least one tank containing an electrolyte and an electric circuit connected to at least one counter-electrode and to at least one working electrode, the device being characterized in that at least one counter-electrode is positioned in register with the front face of the sample, and the rear face of the sample is put into dry ohmic contact with at least one working electrode that presents structuring patterns that define, along the ohmic contact, insulating portions and conductive portions, which portions correspond to the pattern to be etched and/or deposited on the front face of the sample.

In particular embodiments:

only the front face is in contact with the electrolyte, the rear face being dry relative to the electrolyte, and for this purpose, the tank presents a bottom provided with an opening, and the front face of the sample is placed against the opening with an interposed sealing gasket, e.g. of fluoroelastomer; or the sample and the electrodes are situated in the electrolyte with sealing means arranged to keep the structuring patterns in dry contact with the rear face of the sample.

In a first example, in which at least one working electrode comprises a current feed head presenting a structured surface for putting into ohmic contact with the rear face of the sample and comprising conductive portions in relief determining the pattern to be structured, and also comprising insulating gaps, the structured surface of the current feed head can be obtained by lithography coupled with reactive ion etching (RIE).

In a second example, at least one working electrode comprises a current feed head in ohmic contact with a removable mask presenting structuring patterns comprising conductive portions in relief defining the pattern to be structured together with insulating gaps.

The mask may be a sample of twisted and bonded silicon that has been etched to present the conductive portions in relief defining the pattern to be structured and the insulating gaps, the gaps may be filled with an insulating material flush with the conductive portions in relief, and the insulating material may be electrolyte proof.

In general, the electric circuit includes at least one power supply constituted by a galvanostat/potentiostat. In galvanostat mode, the system has at least one counter-electrode of platinum shaped to form a grid disk or a bottomless basket, and the reaction takes place at constant current. An alternative consists in using the device in potentiostat mode. For this purpose, a third electrode referred to as a "reference electrode" is added to the above-mentioned electrode in the electrolyte and serves to maintain a constant potential between the counter-electrode made of platinum and the working electrode. The device also includes means for stirring the electrolyte.

The method and the device for implementing the method serves in particular to deposit or grow nano-structures such as nano-wires in a manner that is simple, fast, inexpensive, and repetitive, by implementing an electrochemical technique.

Other characteristics of the invention are specified in the following detailed description made with reference to the accompanying figures given by way of example and in which, respectively.

Figure 1:
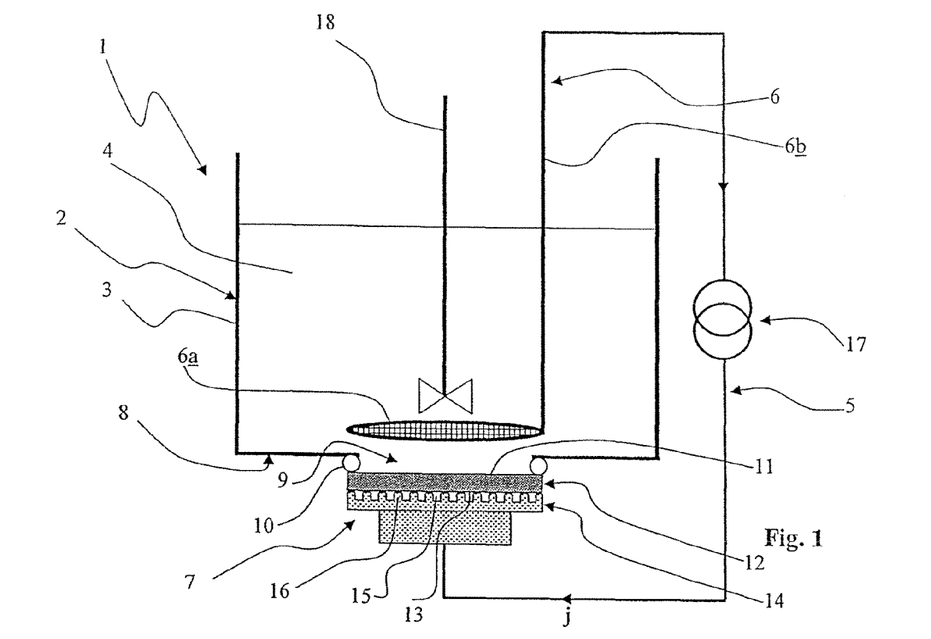
FIG. 1 is a section view of an electrochemical structuring device of the invention for structuring a sample placed between two electrodes.

A first embodiment of an electrochemical device 1 of the invention for micro- and/or nano-structuring is shown in FIG. 1, this device comprising an electrochemical cell 2 provided with a tank 3 containing an electrolytic solution 4 and an electric circuit 5 connected to first and second electrodes 6 and 7.

The tank 3 has a bottom 8 with an opening 9, e.g. with a width of 7 millimeters (mm), 10 mm, 30 mm, or 80 mm, and a sealing gasket 10 against which a front face 11 of a sample 12 of conductive or semiconductor material comes to bear. The front face 11 of the sample 12 is thus placed against the opening 9 in chemical contact with the electrolyte 4.

The tank 3 may be of a material based on tetrafluoroethylene, commonly referred to as Teflon®, which is a material that is relatively inert to numerous chemical species. However it presents the drawback of creep on aging, which can lead to premature leakage. That is why the tank 3 is preferably made of polyvinyl chloride (PVC) that presents greater rigidity, while also withstanding many chemical species. Sealing between the material 12 and the tank 3 is preferably obtained by means of a gasket made of fluoroelastomer such as a Viton gasket.

The counter-electrode 6 is positioned facing the front face 11 of the sample 12 by positioning means (not shown) that may be constituted, for example, by a spacer or an arm suitable for micrometric or nanometric adjustment. In this configuration, the counter-electrode 6 is shaped as a platinum grid disk 6a (FIG. 2) immersed in the electrolyte 4. By way of example, the diameter of the disk 6a is 59 mm, the disk 6a being supported by a rod 6b having a diameter of 2 mm and a height of 150 mm, with the mesh having a side of 0.8 mm and with the wires of the mesh having a diameter of 0.16 mm.

Figure 2:
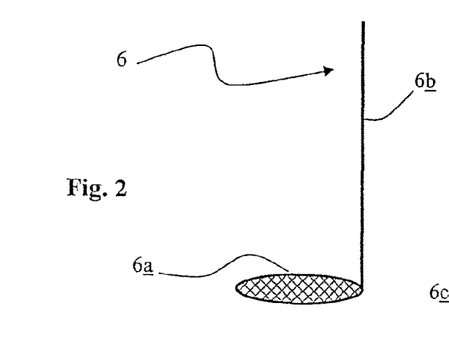
FIG. 2 is a perspective view of a counter-electrode shaped as a grid disk.
Figure 3:
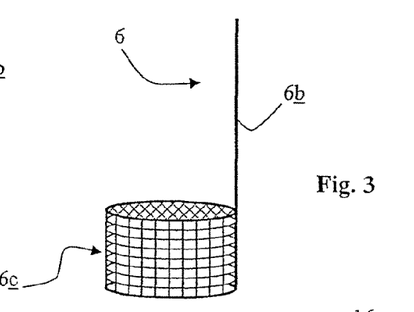
FIG. 3 is a perspective view of the counter-electrode shaped as a bottomless basket.

In order to solve the problem of current lines being poorly distributed, the counter-electrode 6 needs to be as close as possible to all of the front face 11 of the sample 12. The grid disk 6a serves not only to reduce the distance between the counter-electrode 6 and the front surface 11 for structuring, but it also serves to distribute the current uniformly and in rectilinear manner in the vicinity of the front face 11. Advantageously, a counter-electrode 6 is used that is shaped in the form of a bottomless basket (FIG. 3) provided with both a support rod 6b and a bottomless mesh basket 6c. The bottomless basket is further away from the surface of the sample than is a grid disk, but it offers the advantage of enabling a stirrer 18 to be placed closer to the surface, and thus of enabling the solution to be made uniform, while still providing a distribution of current lines that is relatively uniform.

The sample 12 also presents a rear face 13 opposite from its front face 11 and that is in dry ohmic contact with a working electrode 7 presenting a current feed head 7a and structuring patterns 14 put into ohmic contact with the rear face 13 of the sample, which contact is "dry"—i.e. no electrolyte is involved—and determining along the ohmic contact both insulating portions 15 and conductive portions 16 that are suitable for defining a pattern to be structured on the front face 11 of the sample 12. The insulating portions 15 are gaps that are made insulating by the presence of air, and the conducive portions 16 are portions formed in relief.

The rear face 13 of the sample 12 is connected to the electric circuit 5 by an electrode 7 having its current feed head 7a presenting structuring patterns 14a that are formed integrally (FIG. 5) on its surface that is to come into contact with the rear face 13 of the material.

Figure 4:
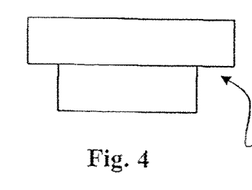
FIG. 4 is a section view of a blank for a working electrode prior to structuring in accordance with the invention.

Since the current feed head 7a shown in FIG. 4 is conductive, it is generally made of metal. The direct structuring of its surface may be performed by etching so as to obtain the electrode having the structured surface shown in FIG. 5. For nanometric etching, it is preferable to use lithography coupled with reactive ion etching.

Figure 6:
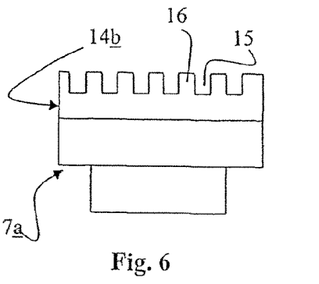

FIG. 6 shows an alternative to direct structuring of the electrode, which alternative consists in making a conductive and structured mask 14b that is placed removably in ohmic contact with a non-structured feed head 7a.

The mask 14b may be fabricated by any available technique that makes it possible to obtain conductive portions and insulating portions. By way of example, in the nanometric range, it is possible to use a conductor or semiconductor sample that has previously been etched. Such a mask 14b may be constituted by the above-described twisted and bonded silicon samples that have been surface-etched.

Figure 7:
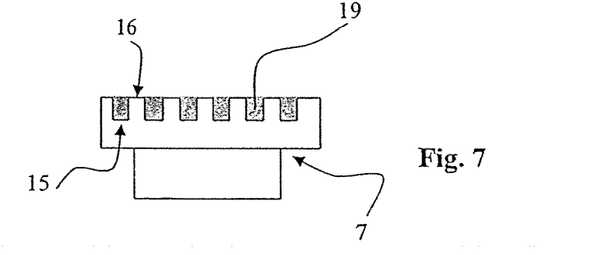
FIG. 7 is a section view of the working electrode of FIG. 5 in combination with an insulating material.

In such embodiments, air may suffice as an insulator, however it is possible to deposit material 19 that is more insulating than air in the etched gaps 15 (FIG. 7), e.g. when there is a risk of charge being transferred between the conductive portions in relief 16 by the tunnel effect through the insulating gaps 15.

Charge transfer through an insulating barrier is an important point when complying with the characteristic sizes of the etching. In galvanostat mode, the resulting electrochemical reactions (etching or deposition) are obtained at constant current density j for a current density and potential difference pair of about 100 microamps per square centimeter ($\mu A/cm^2$) to a few hundreds of $\mu A/cm^2$ for j, and a maximum of 1 volt (V) for the potential difference, but usually using a smaller value. With these values and using air as the insulator, current does not pass for patterns of micrometer size and even for patterns having a size of a few hundreds of nanometers. In the nanometric range (100 nm to a few nanometers), current can pass by the tunnel effect, but at low current values it is stopped above 10 nm of air.

The insulating material 19 is deposited in such a manner as to be flush with the conductive portions in relief so that contact between the electrode and the sample takes place continuously over the surface of the rear face 13 of the sample 12.

The samples 12 for structuring that can be used in methods of the invention (as described below) are necessarily made of conductive materials, semiconductor materials that are strongly doped, or semiconductor materials that are weakly doped.

Strongly-doped semiconductor materials (number of doping elements greater than $10^{18}$ per cubic centimeter ($cm^3$), and resistivity $\rho$ less than 0.01 ohm centimeters ($\Omega cm$)) present metallic behavior and consequently have good ohmic contact with the current feed head 7.

In contrast, weakly-doped semiconductor materials 12 (number of doping elements less than $10^{16}$ $cm^{-3}$, and resistivity $\rho$ in the range 4 $\Omega cm$ to 6 $\Omega cm$) require a metal to be deposited on the rear face 13 (e.g. aluminum) followed by annealing so as to have sufficient ohmic contact to obtain the desired electrochemical reaction.

The electrochemical cell also includes holder means (not shown) for holding the sample 12 against the gasket 10 and means for obtaining dry ohmic contact (not shown) between the rear face 13 of the sample 12 and the masking means 14, where these functions can be achieved by clamping that presses the current feed head 7 against the masking means 14, itself placed against the material 12, itself compressing the gasket 10. The two electrodes 6 and 7 are connected by the electric circuit 5 that includes a galvanostat/potentiostat 17 and a rotary stirrer 18 is preferably used for making the electrolytic solution 4 uniform. The stirrer is generally made of Teflon®, and by way of example its diameters may be 10 mm concerning its rods and 25 mm concerning its "propeller".

When the electric circuit 5 is closed, an electric current j is established between the material and the current feed head under a potential difference V, the galvanostat/potentiostat 17 being capable of delivering either a constant current or a constant voltage.

The electrochemical structuring implemented by the device 1 as described above consists in placing the front face 11 of the sample 12 in contact with the electrolyte 4, in placing the counter-electrode 6 in the electrolyte 4 so as to place the front face 11 of the sample 12 that is to be structured, in placing the working electrode 7 in dry ohmic contact with the rear face 13 of the sample 12, the working electrode presenting structuring patterns 14a or 14b, and in causing an electric current to flow between the two electrodes so as to obtain an electrochemical reaction at the interface between the front face 11 of the sample 12 and the electrolyte 4 with a current density that is modulated by the structuring patterns 14a or 14b of the working electrode 7 so as to perform etching or deposition of or on the front face 11 of the sample 12.

The electrochemical reaction then takes place at the interface between the front face 11 and the electrolyte 4. Depending on the current flow direction, if the current feed head 7 is the anode and the platinum counter-electrode 6 is the cathode, then an oxidation reaction takes place on the front face 11, i.e. an etching reaction. Conversely, if the current feed head 7 is the cathode and the platinum counter-electrode 6 is the anode, then a reduction reaction takes place on the front face 11 of the sample 12, i.e. a deposition reaction.

Figure 5:
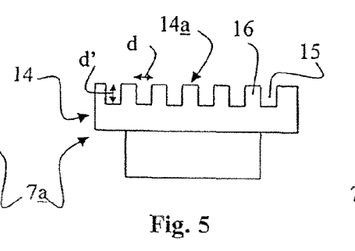
FIGS. 5 and 6 are section views of two embodiments of a working electrode made from the electrode of FIG. 4.

Given the structuring 14, the field lines apply only at the points of contact between the rear face 13 of the sample 12 and the current feed head 7 and they are transmitted through the sample with modulation in sideways (lateral) directions, providing the characteristic distances d and d' are not too small for a given j & V pair (FIG. 5). The electrochemical reaction takes place at the interface between the electrolyte 4 and the front face 11 with modulated current density. The reaction therefore takes place more quickly where current density is higher, and more slowly where current density is lower. This modulation of the current density depends on the pattern formed on the current feed head 7.

Thus, in the invention, the masking applied to the rear face 13 is expressed through the conductive or semiconductor material 12, and structuring takes place on the front face 11.

Once the current feed head 7a is structured at 14a—or is provided with a mask 14b—it is possible to reproduce the pattern on a sample 12 by electrochemical reaction—deposition or etching) for as long as necessary and in a single technological step that requires few operations.

Figures 9, 10:
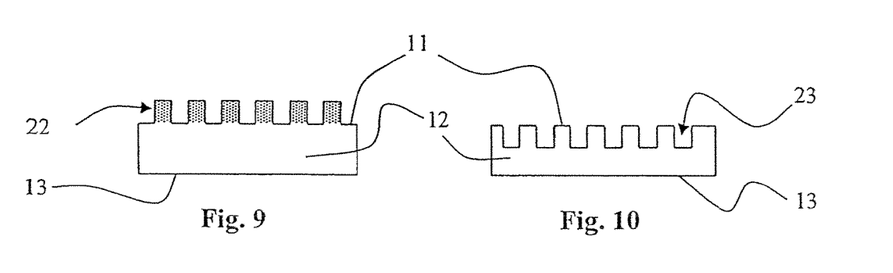
FIG. 9 is a section view of a sample of conductive material on which structures have been deposited by the method of the invention.
FIG. 10 is a section view of a sample of conductive material having structures etched thereon by the method of the invention.

It is thus possible by electrochemical techniques to deposit or grow nano-structures—e.g. nano-wires 22 (FIG. 9)—or to etch nano-structures—e.g. nano-furrows 23 (FIG. 10)—in a manner that is simple, fast, inexpensive, and repeatable.

The choice of electrolyte 4 and the way in which the electrodes 6 and 7 are connected determine the reactions and the structures that are obtained.

Examples of Anode Etching

In order to etch the sample 12, the working electrode 7 is connected to the electric circuit 5 so as to constitute an anode. An oxidation reaction then occurs on the front face 11. To perform etching, an acid electrolytic solution 4 is generally selected. The acid is selected preferably, but not exclusively, from the group constituted by: hydrofluoric acid; hydrochloric acid; orthophosphoric acid; oxalic acid; sulfuric acid; and chromic acid.

EXAMPLE 1

Obtaining Localized Electropolishing of Silicon in Galvanostat Mode

The selected electrolyte is a solution of hydrofluoric acid having a concentration lying in the range 0.5% to 5% by volume.

The sample 12 for structuring is a silicon wafer having its front face 11 placed in contact with this low concentration solution of hydrofluoric acid. A working electrode 7 with structure 14a or provided with a mask 14b is placed in dry contact with the rear face 13 situated opposite from the front face 11. When current flows through the silicon wafer, a localized oxidation reaction occurs at the interface between the electrolyte 4 and the front face 11 in register with the conductive portions in relief defining the pattern to be structured. The current, voltage, and time values are adapted as a function of the desired depth of etching, of the distances between the connective portions in relief, and on the presence or absence on insulating materials for the purpose of avoiding the tunnel effect.

EXAMPLE 2

Obtaining Porous Silicon with an Ordered Porous Super-Structure in Galvanostat Mode The selected electrolyte is a solution of ethanoic hydrofluoric acid at a concentration in range 15% to 25% by volume. Adding ethanol improves removal of the hydrogen that is given off during the reaction. The concentration of ethanol in the solution is 50%.

The method is the same as above, but the electrolytic solution is more concentrated. In this example likewise, the values for the current, the voltage, and time are adapted as a function of the depth desired for the etching, the distances between the conductive portions in relief, and the presence or absence of insulating material for the purpose of avoiding the tunnel effect.

Because of the structuring of the electrode in dry contact, the porosities although disordered present an ordered super-structure. Thus, the disordered porous super-structure can be obtained solely locally in positions that are controlled by the pattern etched on the face 14a of the current feed head 7 or the mask 14b, or the negative thereof. In addition, the size of the pores is small.

EXAMPLE 3

Obtaining Localized Silicon Oxide in Galvanostat Mode

The selected electrolyte is a solution of hydrofluoric acid at a concentration lying in the range 0.1 M to 1 M. The method is identical to those described above. In this example likewise, the values for the current, the voltage, and time are adapted as a function of the depth desired for the etching, of the distances between the conductive portions in relief, and on the presence or absence of insulating material for the purpose of avoiding the tunnel effect.

Finally, the method of the invention also makes it possible, by way of example, to obtain, in an acid medium (orthophosphoric acid, oxalic acid, sulfuric acid, chromic acid, ... ), and in easy and highly reproducible manner, porous aluminum matching the pattern etched on the working electrode and serving in particular to provide protection against corrosion and to provide electrical insulation. For this purpose, the device is used in potentiostat mode, with the applied voltage determining the distance between the pores.

CATHODE DEPOSITS

In order to obtain a deposit on the front face 11 of the sample 12, the working electrode 7 is connected to the electric circuit 5 in such a manner as to constitute a cathode. A reduction reaction then takes place on the front face 11.

The cathodic reaction serves to deposit not only metals, e.g.: Mg; Ni; Pd; Fe; Sn; but also alloys, e.g.: Cu—Sn; Cu—Zn; Ni—Zn.

As a function of the material that is to be deposited, appropriate electrolytic solutions are used of the $CuSO_4$ type at molar concentration in order to deposit copper; $SnSO_4$ for depositing tin; $CoSO_4$ for depositing cobalt; $FeSO_4$ for depositing iron; $NiSO_4$ for depositing nickel; $ZnSO_4$ for depositing zinc; etc.

Depending on the structuring (etching or deposition) performed, in galvanostat mode, the current values are selected to lie between less than 100 $\mu A/cm^2$ to more than 100 $mA/cm^2$. In potentiostat mode, the voltage values are selected to lie in the range 1 V to 100 V.

Figure 8:
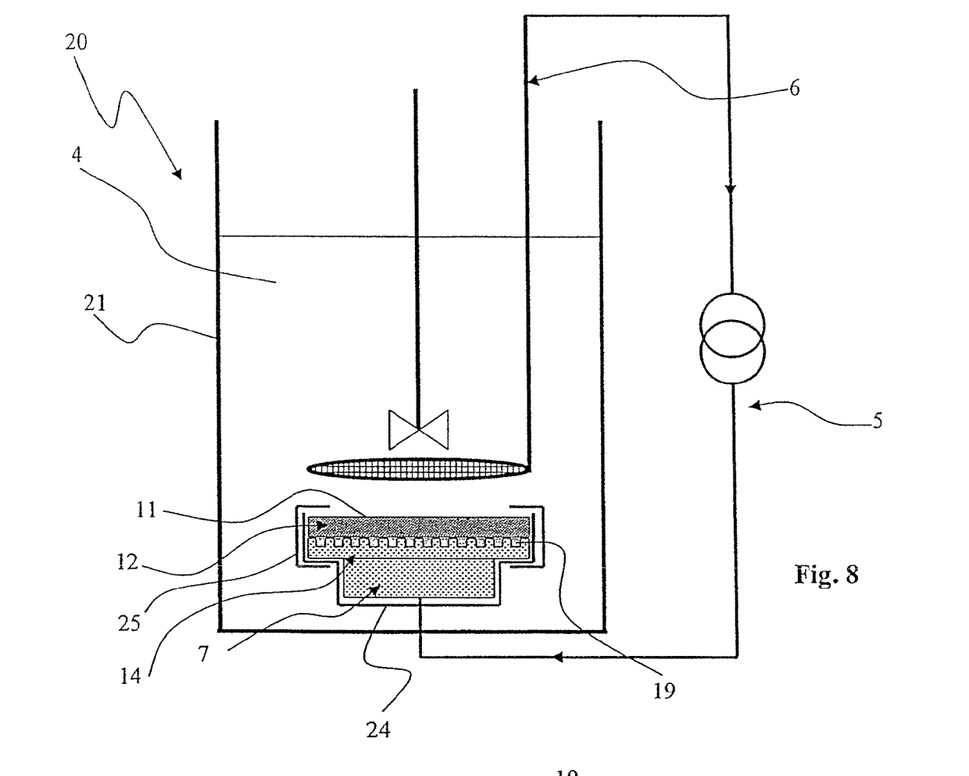
FIG. 8 is a section view of another embodiment of an electrochemical structuring device of the invention.

Filling the gaps 5 with insulating material 19 can also make it possible to obtain a second embodiment of the invention as shown in FIG. 8.

Unlike the electrochemical structuring device 1 of FIG. 1, the electrochemical structuring device 20 of FIG. 8 presents a tank 21 that is not perforated. The sample 12 and the first and second electrodes 6 and 7 are insulated in the electrolyte 4 with sealing means 19 arranged to keep the structuring patterns 14 in dry ohmic contact with the rear face 13 of the sample 12 when the assembly is plunged completely into the electrolyte. For this purpose, clamping jaws are used for maintaining the clamping.

In the embodiment shown, the insulating material 19 is selected to be proof against the electrolyte 4 so as to prevent it from becoming inserted in the gap 15 and so as to enable the front face of the sample 12 to be structured even though the entire assembly is in the electrolyte 4. Furthermore, the current feed head needs to be covered in an electrically insulating material 24 that is also inert with respect to the electrolytic solutions.

Contact between the masking means 14 and the rear face 13 of the sample 12 can thus also be said to be dry in this embodiment, since even when the working electrode 7 is immersed in the electrolyte 4, it is pressed with its entire surface 14a (or 14b when the structuring patterns are carried by removable mask pressed in ohmic contact against the electrode) against the rear face 13 of the sample 12 such that the electrolyte 4 cannot become inserted or subsist between the rear face 13 of the sample 12 and a surface that is defined by the conductive portions in relief 16 and the flush insulating material 19.

Naturally, means are provided for maintaining the contact 25 (clamping jaws) within the assembly constituted by the material 12 for structuring, the structuring patterns 14 and the working electrode 7 so that the ohmic contact remains dry.

In order to perform electrochemical structuring with the device 20:

the rear face 13 of the sample 12 is connected electrically to the electric circuit 5 via a dry ohmic contact with masking means 14 electrically connected to the current feed head 7;

sealing means are placed to keep the insulating gaps 15 in dry contact with the rear face 13—where such sealing may be obtained by selecting an insulating material 19 that is suitable for being proof against the electrolyte 4 or by placing a sealing gasket around the interface between the rear face 13 and the mask 14—;

the front face 11 of the sample 12 is placed in contact with the electrolyte 4 by immersing the assembly comprising the material 12, the masking means 14, and the current feed head 7 completely in the electrolyte 4; and then a counter-electrode 6 is placed in the electrolyte 4 in register with the front face 11 of the sample 12.

When the electric circuit 5 is closed, structuring is obtained in the same manner and with the same results as in the first embodiment.

Figure 11:
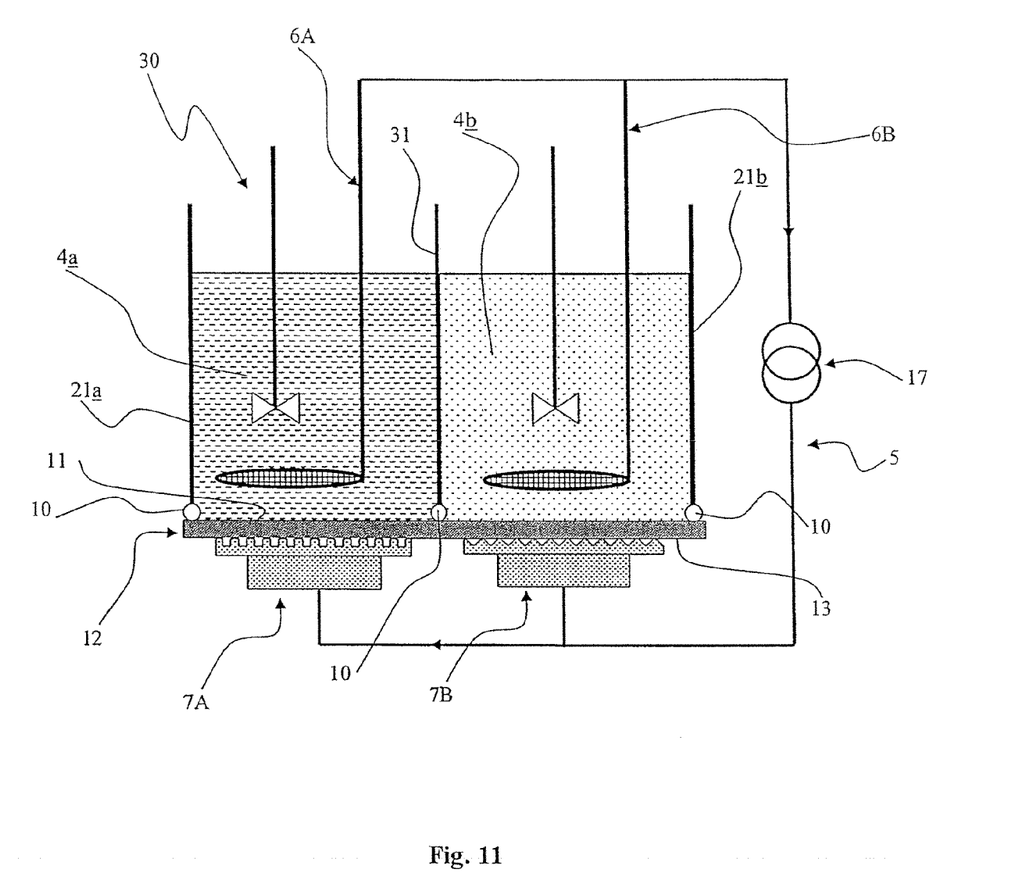
FIG. 11 is a section view of an electrochemical structuring device of the invention enabling a plurality of types of structuring to be performed simultaneously on a single sample.

The embodiment shown in FIG. 11 shows an electrochemical structuring device 30 that presents a tank 21a and a tank 21b that are separated from each other by at least one leakproof wall 31.

Each tank 21a and 21b contains a respective electrolyte 4a or 4b, which electrolyte may be identical or different depending on the structuring desired by the user. The bottoms of the tanks 21a and 21b are perforated and present respective sealing gaskets 10 suitable for coming into contact with the top face 11 of the sample 12 that is to be structured.

Two working electrodes 7A and 7B are placed in dry ohmic contact against the rear face 13 of the sample 12, each substantially in register with a corresponding counter-electrode 6A or 6B. The two working electrodes 7A and 7B present different structuring patterns, thus making it possible to obtain simultaneously two structured regions on the sample 12 in identical or different manners, depending on the electrolyte used. Naturally, it is possible to obtain more than two identical or different regions by providing a plurality of tanks and a plurality of counter-electrode and working electrode pairs. In addition, the device of FIG. 11 may operate with a plurality of constant current sources and/or constant voltage sources, e.g. in the form of a multiple galvanostat/potentiostat.

According to other characteristics:

the dry contact may be obtained with a conventional electrochemical cell having a closed bottom by placing the front face of the material against the surface of the electrolyte and by leaving the rear face of the material outside the electrolyte. Under such circumstances, it can be useful to provide positioning means that are can be fitted to the equipment if the level of the electrolyte should change—e.g. by evaporation;

the masking means may be constituted by a material constituted by laterally juxtaposing conductive layers and insulating layers, which layers may be also selected to be proof against the electrolyte; and the sealing means may be a gasket surrounding the masking means 14 so as to be pressed into dry contact with the rear face 13 of the sample 12, so that the electrolyte cannot be insinuated in the gaps 15.

CITED BIBLIOGRAPHIC REFERENCES

G. Wallis and D. I. Pomerantz, J. Appl. Phys. 40, 3946 (1969).

M. Schimbo, K. Furukawa, K. Fukuda, and K. Tanzawa, J. Appl. Phys. 60, 2987 (1986).

D. Buttard, J. Eymery, F. Fournel, P. Gentile, F. Leroy, N. Magnea, H. Moriceau, G. Renaud, F. Rieutord, K. Rousseau, J. L. Rouviere, IEEE, J. Quantum Electronics 38, 995-1005 (2002).

F. Fournel, H. Moriceau, B. Aspar, K. Rousseau, J. Eymery, J. L. Rouviere, N. Magnea, Appl. Apys. Lett. 80, 793 (2002).

F. Leroy, J. Eymery, P. Gentile, F. Rournel, Surface Science 545, 211 (2003).

R. S. Wagner and W. C. Ellis, Appl. Phys. Lett. 4, 89 (1964).

J. W. Dailey, J. Taraci, and T. Clement, J. Appl. Phys., 96 (12), Dec. 15, 2004.

T. Martensson, P. Carlberg, M. Borgström, L. Montelius, W. Seifert, L. Samuelson, Nanoletters 4, 699 (2004).

A. Ulhir, Bell System Tech. J. 35 333 (1956).

D. R. Turner, J. Electrochem. Soc. 105, 402 (1958).

G. Cullis, L. T. Canham, P. D. J. Calcott, J. Appl. Phys. 82, 909 (1997).

T. Nakagawa, H. Sugiyama, N. Koshida, Jpn J. Appl. Phys. 37, 7186 (1998).

G. Lerondel, R. Romestain, J. C. Vial, M. Thönnissen, Appl. Phys. Lett. 71, 196 (1997).

Heidari, L. Olsson, International patent application WO 99/459179 (Sep. 10, 1999), priority date: Mar. 5, 1998.

P. Möller, M. Fredenberg, P. Wiven-Nilsson, International patent application WO 02/103085 A1 (Dec. 27, 2002), priority date: Jun. 15, 2001.

S. Jin, International patent application WO 2004/099469 A2 (Nov. 18, 2004), priority date: Apr. 9, 2003.

The invention claimed is:

1. A method of electrochemically micro- and/or nano-structuring a sample of a conductive or semiconductor material having two opposite faces, namely a front face and a rear face, the method being characterized in that it comprises the steps of:
   a) a sample putting step consisting of putting at least the front face of the sample into contact with at least one electrolytic solution stored in at least one tank;
   b) a counter-electrode placing step consisting of placing at least one counter-electrode in an electrolyte in register with the front face of the sample, said front face being for structuring;
   c) a working electrode placing step consisting of placing mechanically and reversibly at least one working electrode presenting structuring patterns into dry ohmic contact with the rear face of the sample; and
   d) an electric current applying step consisting of applying an electric current between at least one counter-electrode and at one least working electrode that are substantially in register with each other in order to obtain an electrochemical reaction at the interface between the front face of the sample and the electrolyte with current density that is modulated by the structuring patterns of the working electrode in order to perform etching and/or deposition on the front face of the sample.

2. An electrochemical structuring method according to claim 1, in which, depending on the flow direction of the current, the electrochemical reaction is either an oxidation reaction leading to etching of the front face of the sample, or a reduction reaction leading to deposition on the front face of the sample.

3. An electrochemical structuring method according to claim 2, in which the oxidation reaction leading to etching is obtained by causing at least one counter-electrode to act as a cathode and the working electrode substantially in register therewith to act as an anode, and using an electrolytic solution.

4. An electrochemical structuring method according to claim 3, wherein the electrolytic solution is made of: hydrofluoric acid, hydrochloric acid, orthophosphoric acid, oxalic acid, sulfuric acid, or chromic acid, at varying concentrations.

5. An electrochemical structuring method according to claim 2, in which the reduction reaction leading to a deposit is obtained by causing at least one counter-electrode to act as an anode and causing the working electrode substantially in register therewith to act as a cathode, and with an electrolytic solution that is a function of the material that is to be deposited on the front face of the sample.

6. A device for electrochemically structuring a sample of a conductive or semiconductor material that has two opposite faces, namely a front face and a rear face, the device serving to implement the method according to claim 1, the device comprising an electrochemical cell provided with at least one tank containing an electrolyte and an electric circuit connected to at least one counter-electrode and to at least one working electrode, the device being characterized in that at least one counter-electrode is positioned in register with the front face of the sample, and the rear face of the sample is put mechanically and reversibly into dry ohmic contact with at least one working electrode that presents structuring patterns that define, along the ohmic contact, insulating portions and conductive portions, which portions correspond to the pattern to be etched and/or deposited on the front face of the sample.

7. An electrochemical structuring device according to claim 6, in which only the front face is in contact with the electrolyte, the rear face being dry relative to the electrolyte.

8. An electrochemical structuring device according to claim 7, in which the tank presents a bottom provided with an opening, and the front face of the sample is placed against the opening with an interposed sealing gasket.

9. An electrochemical structuring device according to claim 8, in which the gasket is made of a fluoroelastomer.

10. An electrochemical structuring device according to claim 6, in which the sample and the electrodes are situated in the electrolyte with sealing means arranged to keep the structuring patterns in dry contact with the rear face of the sample.

11. An electrochemical structuring device according to claim 6, in which at least one working electrode comprises a current feed head presenting a structured surface for putting into ohmic contact with the rear face of the sample and comprising conductive portions in relief determining the pattern to be structured, and also comprising insulating gaps.

12. An electrochemical structuring device according to claim 11, in which the structured surface of the current feed head is obtained by lithography coupled with reactive ionic etching.

13. An electrochemical structuring device according to claim 6, in which at least one working electrode comprises a current feed head in ohmic contact with a removable mask presenting structuring patterns comprising conductive portions in relief defining the pattern to be structured together with insulating gaps.

14. An electrochemical structuring device according to claim 13, in which the mask is a sample of twisted and bonded silicon that has been etched to present the conductive portions in relief defining the pattern to be structured and the insulating gaps.

15. An electrochemical structuring device according to claim 11, in which the gaps are filled with an insulating material flush with the conductive portions in relief.

16. An electrochemical structuring device according to claim 10, in which the insulating material is proof to the electrolyte.

17. An electrochemical structuring device according to claim 6, in which the electric circuit includes at least one power supply constituted by a galvanostat/potentiostat.

18. An electrochemical structuring device according to claim 6, in which a counter-electrode is a platinum electrode shaped as a grid disk or a bottomless basket.

19. An electrochemical structuring device according to claim 6, further including means for stirring the electrolyte.

20. An electrochemical structuring device according to claim 15, in which the insulating material is proof to the electrolyte.

* * * * *